United States Patent
Lasseuguette et al.

(10) Patent No.: US 9,397,690 B2
(45) Date of Patent: Jul. 19, 2016

(54) APPARATUS AND METHOD FOR MONITORING ELECTRICAL CURRENT

(71) Applicants: Jean Lasseuguette, L'Union (FR);
Jérôme Casters, Toulouse (FR);
Stéphane Ollitrault, Seysses (FR);
Thierry Robin, Plaisance du Touch (FR); Olivier Tico, Saint Lys (FR)

(72) Inventors: Jean Lasseuguette, L'Union (FR);
Jérôme Casters, Toulouse (FR);
Stéphane Ollitrault, Seysses (FR);
Thierry Robin, Plaisance du Touch (FR); Olivier Tico, Saint Lys (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/766,762

(22) PCT Filed: Mar. 21, 2013

(86) PCT No.: PCT/IB2013/000705
§ 371 (c)(1),
(2) Date: Aug. 10, 2015

(87) PCT Pub. No.: WO2014/147436
PCT Pub. Date: Sep. 25, 2014

(65) Prior Publication Data
US 2015/0381198 A1   Dec. 31, 2015

(51) Int. Cl.
*H03M 3/00* (2006.01)
*G01R 19/25* (2006.01)
(Continued)

(52) U.S. Cl.
CPC ........... *H03M 3/356* (2013.01); *G01R 19/2509* (2013.01); *G01R 31/361* (2013.01);
(Continued)

(58) Field of Classification Search
CPC ......... H03K 7/08; H03G 3/001; H03M 3/356; H03M 3/32; H03M 3/496; G01R 31/361; G01R 31/3682; G01R 31/3658; G01R 31/3631; G01R 31/3679; G01R 31/3648; G01R 31/3651; G01R 31/3624; G01R 15/146; G01R 19/252; G01R 19/0092
USPC ....... 341/143; 324/142, 600, 117 R, 522, 427
See application file for complete search history.

(56) References Cited

U.S. PATENT DOCUMENTS

| 3,976,942 A | 8/1976 | Mayfield |
| 4,096,436 A | 6/1978 | Cook et al. |

(Continued)

FOREIGN PATENT DOCUMENTS

| DE | 102007028344 A1 | 12/2008 |
| DE | 102011078698 B3 | 11/2012 |

(Continued)

OTHER PUBLICATIONS

International Search Report and Written Opinion correlating to PCT/IB2013/000705 issued on Dec. 13, 2013.

(Continued)

*Primary Examiner* — Lam T Mai

(57) ABSTRACT

An apparatus for sensing current of a vehicle battery employs an extended counting analog-to-digital conversion process (212) to a chopped and amplified voltage appearing across a low ohmic shunt resistor (203) placed between the negative pole of the vehicle's battery and the chassis ground of the vehicle. Gain adjustment control of a programmable gain amplifier (209) by matching the gain to the dynamic range of the ADC (212) permits a high dynamic signal sensing.

11 Claims, 3 Drawing Sheets

(51) Int. Cl.
*H03G 3/00* (2006.01)
*G01R 31/36* (2006.01)
*G01R 1/20* (2006.01)
*G01R 15/14* (2006.01)

(52) U.S. Cl.
CPC ............ *G01R31/3682* (2013.01); *H03G 3/001* (2013.01); *H03M 3/32* (2013.01); *H03M 3/496* (2013.01); *G01R 1/203* (2013.01); *G01R 15/146* (2013.01); *G01R 31/3606* (2013.01)

(56) References Cited

U.S. PATENT DOCUMENTS

| | | | |
|---|---|---|---|
| 5,764,706 A | 6/1998 | Carlin et al. | |
| 5,831,412 A * | 11/1998 | Morioka | G01R 31/3624 320/106 |
| 5,856,711 A * | 1/1999 | Kato | H02H 3/087 307/10.6 |
| 6,008,629 A * | 12/1999 | Saeki | H01M 10/425 320/140 |
| 6,044,295 A * | 3/2000 | Pilz | A61N 1/378 607/29 |
| 6,140,799 A * | 10/2000 | Thomasson | H01M 10/441 320/117 |
| 6,178,516 B1 * | 1/2001 | Meade | G06F 1/24 713/300 |
| 6,184,660 B1 * | 2/2001 | Hatular | H02J 7/022 320/139 |
| 6,184,794 B1 * | 2/2001 | Tucholski | H01M 6/505 324/426 |
| 6,211,652 B1 * | 4/2001 | Glasgow | H01M 10/44 320/136 |
| 6,215,435 B1 | 4/2001 | Parry et al. | |
| 6,789,026 B2 | 9/2004 | Barsoukov et al. | |
| 6,791,479 B2 * | 9/2004 | Kraus | G01R 31/318533 324/522 |
| 7,696,725 B2 | 4/2010 | Liu et al. | |
| 2004/0061506 A1 | 4/2004 | Rupp | |
| 2006/0164069 A1 | 7/2006 | Maier et al. | |
| 2009/0224771 A1 | 9/2009 | Deveau et al. | |
| 2011/0184675 A1 | 7/2011 | White et al. | |

FOREIGN PATENT DOCUMENTS

| | | |
|---|---|---|
| EP | 2348326 A2 | 7/2011 |
| JP | H10170615 A | 6/1998 |

OTHER PUBLICATIONS

Freescale Document No. MM912_637D1 Rev.3.0 Jan. 2012.
C.Janson, "A high-resolution compact and low-power ADC suitable for array implementation in standard CMOS." IEEE trans. Circuits Syst. I, vol. 42, pp. 904-912, Nov. 1995.
P. Rombouts et al, "A 13.5b 1.2V Micropower Extended Counting AD Converter," IEEE JSSC, vol. 36, No. 2, Jul. 2001.
KIT912J637EVME User's Guide. Freescale Semiconductor, Inc. Feb. 29, 2012. pp. 1-28.

\* cited by examiner

APPARATUS AND METHOD FOR MONITORING ELECTRICAL CURRENT

FIELD OF THE INVENTION

This invention relates to an apparatus and method for monitoring electrical current and particularly, though not exclusively, for monitoring a current supplied by a vehicle battery.

BACKGROUND OF THE INVENTION

In today's vehicles and particularly with the increasing popularity of hybrid and electric vehicles and stop-start systems, the increasing electrical load presents a challenge to the battery. Many vehicle breakdowns caused by the electrical system can generally be avoided by knowing the precise state of the battery. The battery must be able to provide enough energy to crank the engine and be available as a passive power source to support the vehicle's auxiliary electrical systems.

One known battery monitoring device which can communicate with a vehicle's power management system using a local interconnect network (LIN) is the Freescale MM 912J637 module. This known monitoring device is described in Freescale document number MM 912_637D1 Rev. 3.0 1/2012. This device employs a two-channel analog to digital converter for simultaneous measurement of battery voltage and current and an independent analog to digital converter for temperature measurement. Current measurement is achieved with the aid of a low ohmic shunt resistor connected between the negative pole of the battery and the chassis ground of the vehicle. The device is directly connected to and supplied from the battery and located directly on the battery's negative pole. Battery current is measured by measuring the voltage drop across the shunt resistor and is defined as the differential voltage between two inputs of the current sensing channel of the device. This current sensing channel employs sigma delta modulation techniques in order to realise a high resolution analogue to digital conversion process.

While this type of battery monitoring device performs satisfactorily for low voltage (for example lead-acid) batteries, it does not perform so well with high voltage batteries (for example lithium-ion used in electric and hybrid vehicles). There is a requirement for speed of current measurement in the case of high voltage batteries which conventional battery current measurement devices cannot meet. Speed requirement is driven by the number of battery cells to be monitored individually. For lead-acid batteries, a single measurement of the cell stack is sufficient. For Li Ion, between 6 and 12 cells must be measured within a given time window. There are further requirements in the case of high voltage battery monitoring concerning the relatively wide input signal range and the need for accuracy of measurement.

SUMMARY OF THE INVENTION

The present invention provides a vehicle, an apparatus and a method for monitoring electrical current as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Figure 1:
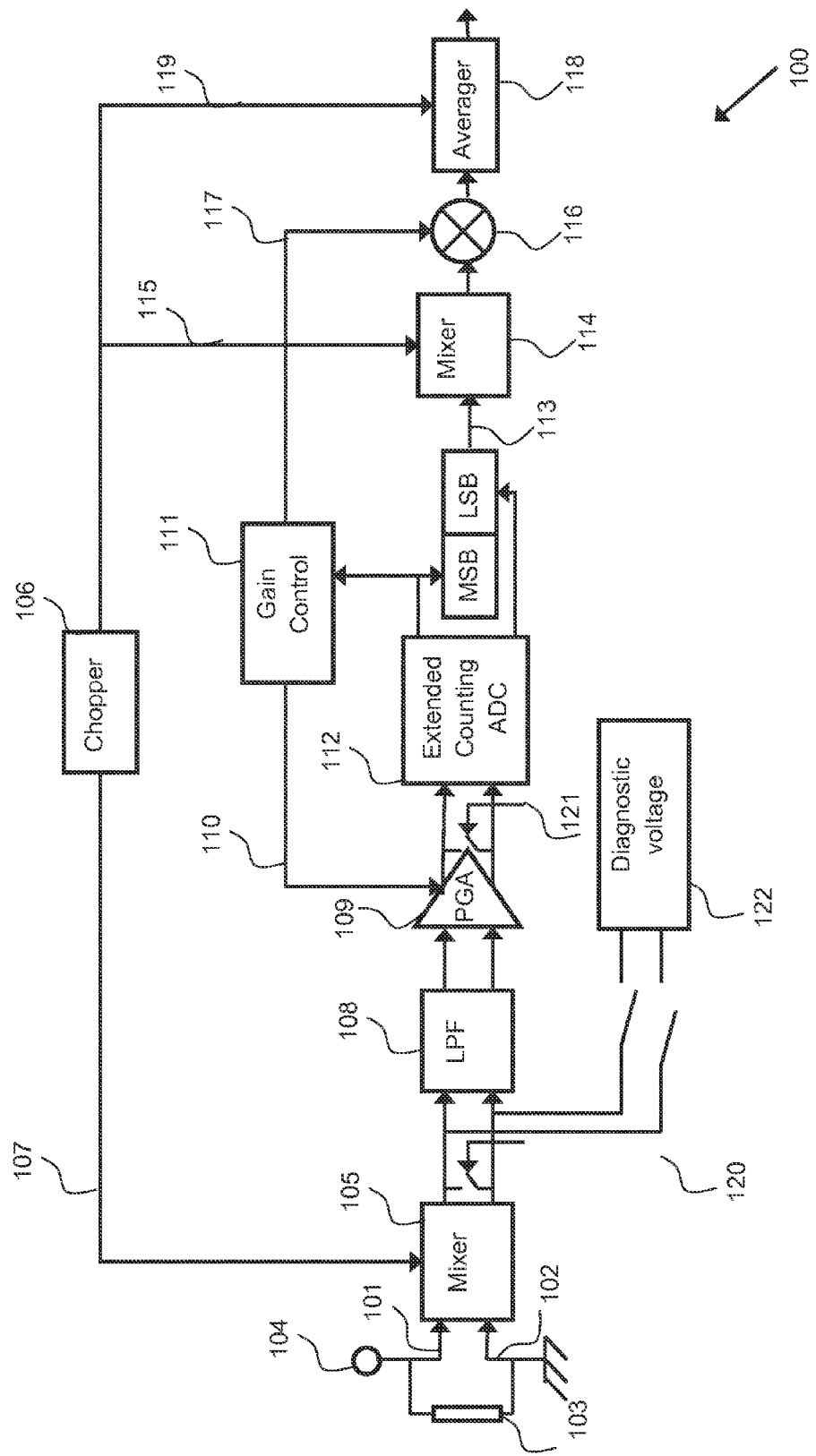
FIG. 1 is a simplified block diagram of a first example of apparatus for monitoring electrical current.

Referring now to FIG. 1, a first example of apparatus 100 for monitoring battery current is provided with two inputs 101, 102 which may be connected across a shunt resistor 103. The shunt resistor 103 may have a value of, typically, around 100 micro Ohms and may be connected so that it senses current flowing from the negative terminal 104 of a battery to a ground reference (such as the chassis of a vehicle in which the battery is placed). This current is monitored by the apparatus 100 by measuring the voltage drop across the shunt resistor 103, that is, between the two inputs 101, 102. A positive voltage drop may mean that a positive current is flowing and a negative voltage drop may mean that negative current is flowing.

The inputs 101, 102 of the apparatus 100 may be connected to an input mixer 105 which may receive an input from a chopper module 106. The chopper module 106 may supply on line 107, a reference clock signal for the purpose of modulating the signals appearing on the inputs 101, 102. In this way, the DC signal to be measured is modulated at a known chopping frequency in order to distinguish between the desired signal and any DC offsets which may be added by subsequent stages of the measuring circuit. If offset and signal are not at the same frequencies, then the offset can be removed by adequate filtering, for example in an average-by-two process. The modulated signals appearing at the output of the input mixer 105 may be fed to a low pass filter 108 whose purpose is to eliminate any high-frequency noise which would be detrimental to the performance of subsequent functions. Filtered output signals from the low pass filter 108 may be fed to a programmable gain amplifier (PGA) 109 whose purpose is to amplify the relatively small signals which may typically range from a few microvolts to several hundred millivolts.

A gain control signal on line 110 may be provided to the PGA 109. The gain of the PGA 109 may be controlled digitally by a gain control module 111 to be described below. Amplified signals appearing at the output of the PGA 109 may be fed to an Extended Counting Analog to Digital Converter (ADC) 112. This analog to digital converter 112 operates in accordance with an extended counting technique such as that described in C. Janson, "A high-resolution, compact and low-power ADC suitable for array implementation in standard CMOS," IEEE trans. Circuits Syst. I, vol. 42, pp. 904-912, November 1995. Briefly, for one analogue to digital conversion, the converter passes through two modes. In the first mode, the converter operates as a resettable first order delta sigma modulator to convert the most significant bits (the counting conversion mode). In a second mode, the least significant bits are converted by an algorithmic analog to digital conversion technique ("extended conversion"). In contrast, delta signal analog to digital converters require digital decimation filters which can take up additional silicon area. High resolution may be obtained but at the expense of oversampling which leads to increased power consumption. The extended counting technique is a compromise between the known sigma delta modulation with its high accuracy but low speed and the known algorithmic analog to digital conversion technique with its higher speed but low accuracy. The main advantages of the extending counting ADC are its speed and low latency.

The extended counting ADC 112 converts an input analog signal into a digital one and outputs the digitised signal on line 113. At this point, the signal on line 113 may include DC offsets introduced by the PGA 109 and ADC 112. The digitised output from the ADC 112 may be fed from the ADC 112 into an output mixer 114. In one example, the most significant bit (MSB) is output from the ADC 112 and fed into the gain control module 111. In the gain control module 111, in a first operation, the modulus (or absolute value) of the MSB is determined (as the output from the ADC 112 could be positive or negative). In a second operation in the gain control module 111, the determined absolute value is compared with pre-defined maximum and minimum threshold values. Depending on this comparison, the gain control module 111 may increase the gain of the PGA 109 if the determined absolute value is below the minimum threshold value or decrease the gain if the determined absolute value is above the maximum threshold value. If the determined absolute value is within a minimum-maximum window then the gain may be held constant. By this means, the amplification provided by the PGA 109 may be set to match the dynamic range of the ADC 112.

In the output mixer 114, the digitised signal which is output by the ADC 112 is mixed with the clock signal from the chopper circuit 106 received on line 115. The mixer 114 demodulates the signal originally modulated by the input mixer 105 and modulates any DC offset which has been introduced by the PGA 109 and ADC 112. The output of the output mixer 114 may be sent to a multiplier 116. The multiplier 116 may also receive an input from the gain control circuit 111 on line 117. In the multiplier 116, a gain compensation signal may be applied in order to compensate for the irregularities in the gain of the analog functions, for example, the PGA 109 and/or the ADC 112. This gain compensation may be determined at final test.

The signal appearing at the output of the output mixer 116 may then be fed to an averager module 118. The averager module 118 may also receive a clock signal on line 119 from the chopper module 106. In the averaging module 118, an average of two successive samples is taken. The desired output signal from the multiplier 116 is now at DC but includes an unwanted DC offset introduced by the PGA 109 and ADC 112 which has been modulated at the chopper module clock frequency by the output mixer 114. The average-by-two filtering process carried out in the averager module 118 has an infinite rejection at the chopper module clock frequency. So the desired DC signal is kept, while the unwanted offset is removed. Hence, this averaging process cancels any offsets in the PGA 109 and the ADC 112. A signal appearing at the output of the averaging module 118 comprises a compensated digital value indicating battery current. The signal may comprise, typically, 16-bit data. The output of the averager 116 may be linked to a digital bus (not shown) so that a user may read the content of this digital value via some appropriate communication means.

In one example, a first switch 120 may be provided to allow zeroing of the input of the PGA 109 in a conventional manner.

In another example, a second switch 121 may be provided for zeroing the input of the ADC 112 in a conventional manner.

In a further example, a diagnostic module 122 may be provided for generating a diagnostic voltage for verifying the operation of the apparatus 100. This may be connected to the inputs of the lowpass filter 108 prior to connecting the apparatus to a battery which is to be monitored.

Figure 2:
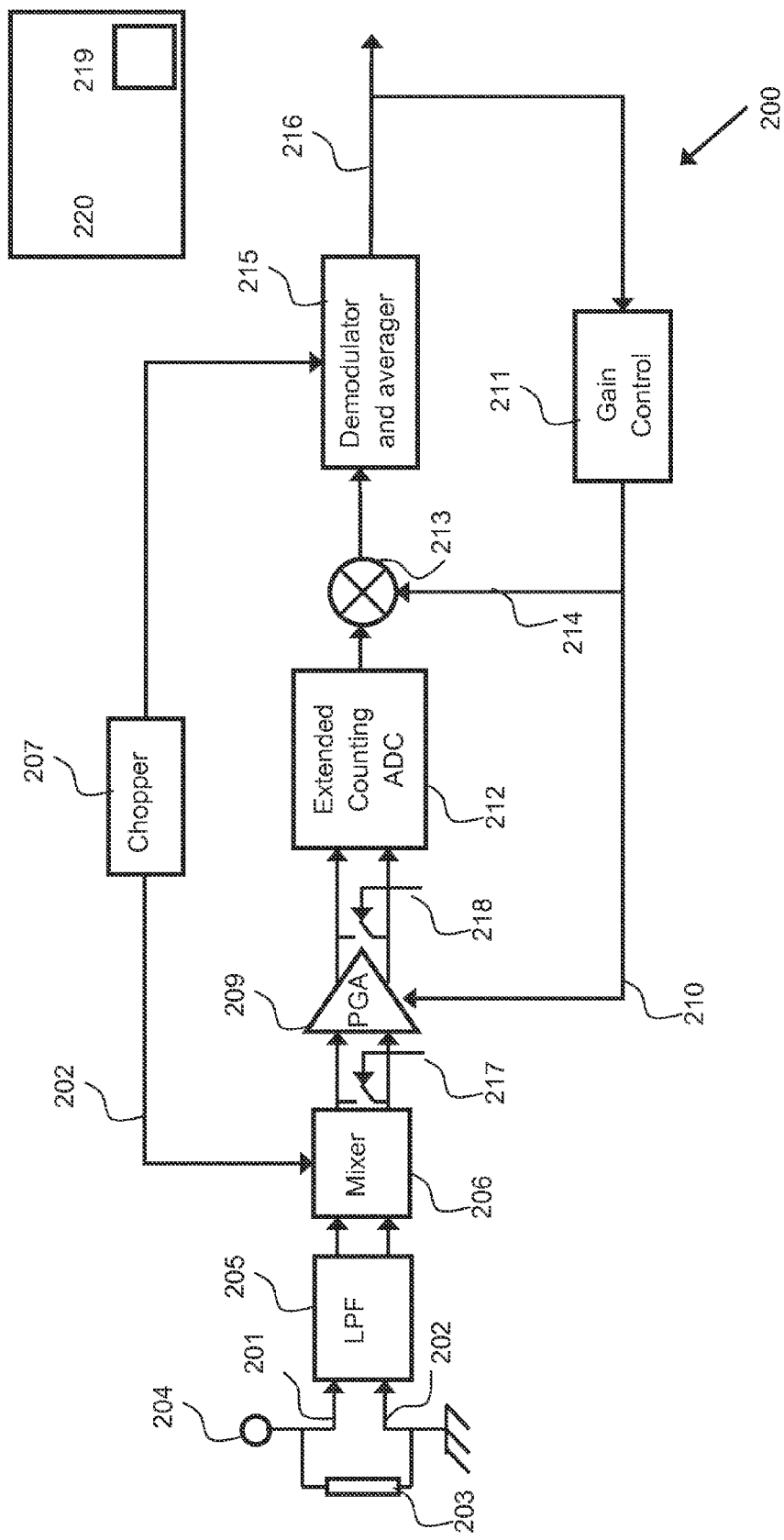
FIG. 2 is a simplified block diagram of a second example of apparatus for monitoring electrical current.

Referring now to FIG. 2, a second example of apparatus 200 for monitoring battery current is provided with two inputs 201, 202 which may be connected across a shunt resistor 203 in a similar fashion to the first example of FIG. 1. The shunt resistor 203 may have a value of, typically, around 100 micro Ohms and in the same fashion as the first example, may be connected so that it senses current flowing from the negative terminal 204 of a battery to a ground reference (such as the chassis of a vehicle in which the battery is placed). This current is monitored by the apparatus 200 by measuring the voltage drop across the shunt resistor 203, that is, between the two inputs 201, 202. A positive voltage drop may mean that a positive current is flowing and a negative voltage drop may mean that a negative current is flowing.

The inputs 201, 202 of the apparatus 200 may be connected to a lowpass filter 205. The lowpass filter 205 eliminates any high-frequency noise on the inputs 201 202, which would be detrimental to the performance of subsequent functions. The outputs of the lowpass filter 205 may be operably coupled to a mixer 206 which may receive an input from a chopper module 207. The chopper module 207 may supply on line 208 a reference clock signal for the purpose of modulating the filtered signals from the lowpass filter 205. In this example, the modulated signals appearing at the output of the mixer 206 are fed to a programmable gain amplifier PGA 209 which amplifies the modulated signals. A gain control signal on line 210 may be provided to the PGA 209. The gain of the PGA 209 may be controlled digitally by a gain control module 211 to be described below. Amplified signals appearing at the output of the PGA 209 may be fed to an extended counting analog to digital converter (ADC) 212. In a similar fashion as described with reference to FIG. 1, the ADC 212 performs an analog to digital conversion of input signals by operating as a resettable first-order delta sigma modulator in a first mode, to convert the most significant bits, and by using an algorithmic analog to digital conversion technique, and a second mode to convert the least significant bits.

The output from the ADC 212 may be fed to a multiplier 213 where it is multiplied with a gain control signal on line 214 provided by the gain control circuit 211. The gain control signal on line 214 serves the purpose in the multiplier of compensating for irregularities in the gain of the analog functions, for example the PGA 209 and/or the ADC 212.

The compensated, digitised output signal from the multiplier 213 may then be fed to a demodulator and averager module 215. The demodulator and averager module 215 may also receive a clock signal from the chopper module 207. After demodulation in the demodulator and averager module 215, the desired output signal from the multiplier 213 is now at DC but includes an unwanted, modulated DC offset introduced by the PGA 209 and ADC 212. A subsequent averaging process takes an average of two successive samples. This average-by-two filtering process carried out in the demodulator and averager module 215 has an infinite rejection at the chopper module clock frequency. So the desired DC signal is kept, while the unwanted offset is removed. Hence, this chopping and averaging process cancels any offsets in the PGA 209 and the ADC 212.

A signal appearing on line 216 at the output of the demodulation and averaging module 215 comprises a compensated digital value indicating battery current. This may comprise, typically, 16-bit data. The output line 216 may be linked to a digital bus (not shown) so that a user may read the content of this digital value by way of some appropriate communication means.

The digitised output on line 216 may also be fed to the gain control module 211 in order to control the gain applied to the PGA 209 and to provide the gain compensation signal applied to the multiplier 213 on line 214. In this way, gain, adjustment may be done using fully compensated data.

The most significant bit (MSB) of the output value on line 216 is fed into the gain control module 211. In the gain control module 211, in a first operation, the modulus (or absolute value) of the MSB is determined (as the output from the ADC 212 could be positive or negative). In a second operation in the gain control module 211, the determined absolute value is compared with predefined maximum and minimum threshold values. Depending on this comparison, the gain control module 211 may increase the gain of the PGA 209 if the determined absolute value is below the minimum threshold value or decrease the gain if the determined absolute value is above the maximum threshold value. If the determined absolute value is within a minimum-maximum window then the gain may be held constant. By this means, the amplification provided by the PGA 209 may be set to match the dynamic range of the ADC 212.

Optionally a first switch 217 may be provided for zeroing the input to the PGA 209 in a conventional manner.

Optionally, a second switch 218 may be provided for zeroing the inputs to the ADC 212 in a conventional manner.

The apparatus 200 for measuring battery current may be attached to a battery 219 of a vehicle 220.

Figure 3:
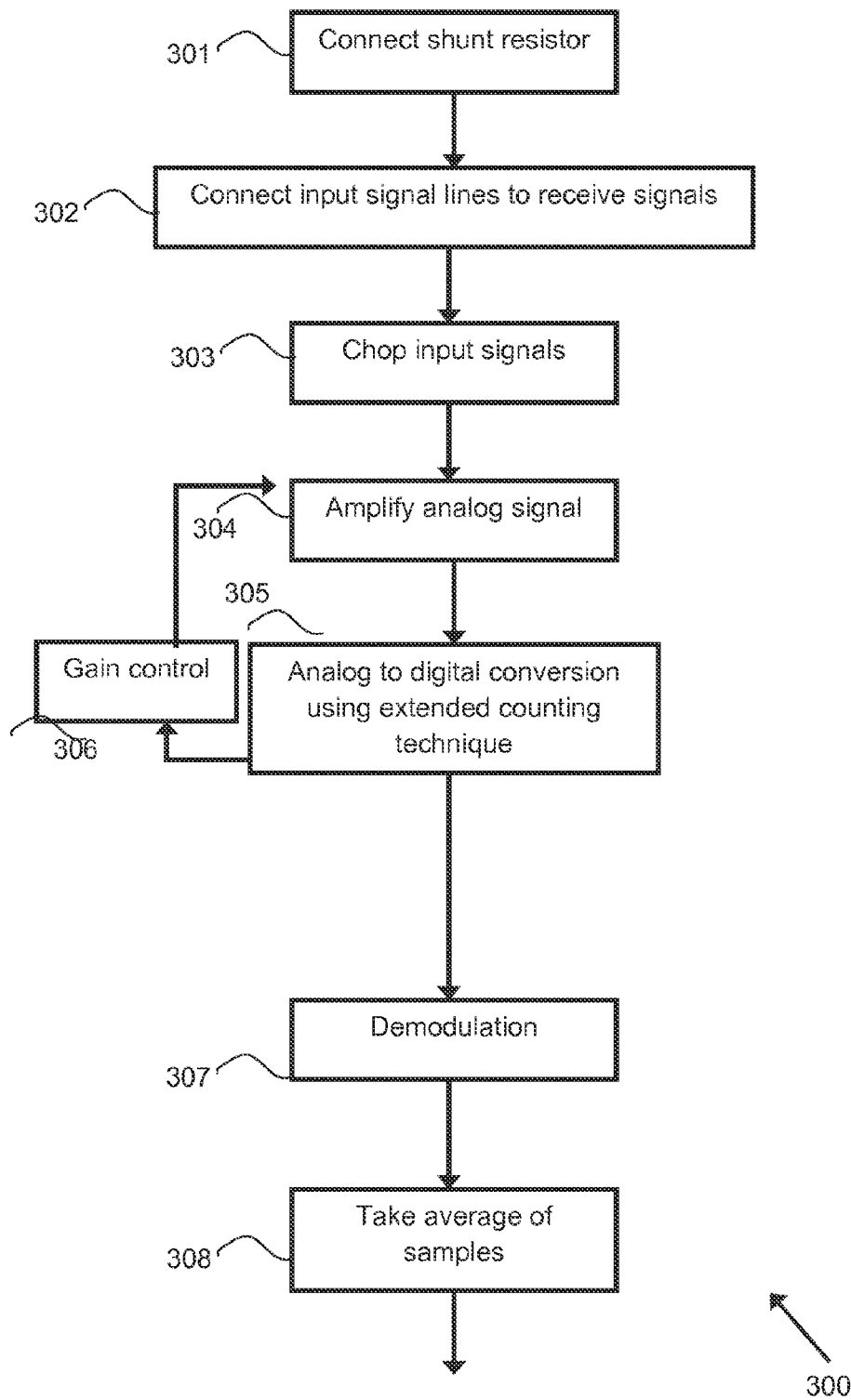
FIG. 3 is a simplified flowchart illustrating an exemplary method for monitoring electrical current.

An example of a method for monitoring electrical current will now be described with reference to FIG. 3 which is a simplified flowchart 300 illustrating an exemplary method of monitoring electrical current. At 301, a shunt resistor is connected in the current supply line, and at 302, input signal lines are connected across the shunt resistor. An input signal which is received on the input signal lines is chopped at 303 to produce a modulated analog signal. At 304, the modulated analog signal is amplified in a variable gain amplifier to produce an amplified analog signal. At 305, the amplified analog signal is converted to digitised samples using an extended counting analog to digital converter. At 306, the gain of the variable gain amplifier is set in response to a value of the digitised samples so that the gain of the variable gain amplifier is matched to the dynamic range of the extended counting analog to digital converter. At 307, the digitised samples which are produced by the extended counting analog to digital converter are demodulated. At 308, unwanted offsets are filtered out by taking an average of successive digitised samples in order to compensate for any offsets introduced by the amplification and analog to digital conversion processes. The resulting averaged, digitised samples represent a current flowing through the shunt resistor and may be fed to a communications bus.

The invention may also be implemented in a computer program for running on a computer system, at least including code portions for performing steps of a method according to the invention when run on a programmable apparatus, such as a computer system or enabling a programmable apparatus to perform functions of a device or system according to the invention.

As an example, a tangible computer program product may be provided having executable code stored therein to perform a method for monitoring electrical current in a supply line, the method comprising; connecting a shunt resistor in said supply line, connecting input signal lines across the shunt resistor, receiving an input signal on said input signal lines, chopping the input signal to produce a modulated analog signal, amplifying the modulated analog signal in a variable gain amplifier to produce an amplified analog signal, converting the amplified analog signal to digitised samples using an extended counting analog to digital converter, controlling the gain of the variable gain amplifier in response to a value of the digitised samples so that a gain of the variable gain amplifier is matched to a dynamic range of the extended counting analogue to digital converter, demodulating the digitised samples, and filtering the demodulated digitised samples to remove any unwanted DC offset.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims. For example, in an alternative embodiment the input gain is split between a PGA and the input stage of the ADC. This can give more flexibility for lowering the requirements on the PGA, and also achieve higher gains. While an average-by-two process has been described in the exemplary embodiments, it will be understood that any process which filters out the unwanted offsets (which are at a different frequency to the desired signal) may be employed.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connections that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the boundaries between functional modules are merely illustrative and that alternative embodiments may merge functional modules or circuit elements or impose an alternate decomposition of functionality upon various functional modules or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, the apparatus of the examples of either of FIG. 1 and FIG. 2 may be implemented within one device. Further, the entire functionality of the various functional modules shown in FIGS. 1 and 2 may be implemented in an integrated circuit. Such an integrated circuit may be a package containing one or more dies in a single package with electronic components provided on the dies that form the modules and which are connectable to other components outside the package through suitable connections such as pins of the package and bondwires between the pins and the dies.

Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A method for monitoring electrical current in a supply line, the method comprising:
    connecting a shunt resistor in said supply line;
    connecting input signal lines across the shunt resistor;
    receiving an input signal on said input signal lines;
    chopping the input signal to produce a modulated analog signal;
    amplifying the modulated analog signal in a variable gain amplifier to produce an amplified analog signal;
    converting the amplified analog signal to digitised samples using an extended counting analog to digital converter;
    controlling the gain of the variable gain amplifier in response to a value of the digitised samples so that a gain of the variable gain amplifier is matched to a dynamic range of the extended counting analogue to digital converter;
    demodulating the digitised samples; and
    filtering the demodulated digitised samples to remove any unwanted DC offset.

2. The method of claim 1 wherein the gain of the variable gain amplifier is set depending on the outcome of a comparison between a most significant bit of an output from the extended counting analogue to digital converter and predetermined maximum and minimum threshold values.

3. The method of claim 1 in which filtering the demodulated digitised samples includes taking an average of successive demodulated digitised samples.

4. Apparatus for monitoring electrical current in a supply line, the apparatus comprising:
- a modulator arranged to modulate an input signal generated by current flowing in said supply line to produce a modulated analog signal;
- a variable gain amplifier arranged to amplify said modulated analog signal to produce an amplified analog signal;
- an extended counting analogue to digital converter arranged to convert the amplified analog signal to digitised samples;
- a gain controller arranged to control the gain of the variable gain amplifier in response to a value of the digitised samples so that a gain of the variable gain amplifier is matched to a dynamic range of the extended counting analogue to digital converter;
- a demodulator arranged to demodulate the digitised samples; and
- a filter arranged to remove any offsets from the demodulated digitised samples introduced by amplification and conversion.

5. The apparatus of claim 4 comprising a multiplier arranged to apply a gain compensation value to the digitised samples.

6. The apparatus of claim 4 comprising a low pass filter for filtering the input signal.

7. The apparatus of claim 4 wherein the gain controller is arranged to receive a most significant bit of the digitised samples produced by the extended counting analogue to digital converter and to compare a value of the received most significant bit with maximum and minimum threshold values and to adjust the gain of the variable gain amplifier depending upon the comparison.

8. The apparatus of claim 4 wherein the apparatus is implemented in one or more integrated circuit devices.

9. A vehicle including the apparatus of claim 4 wherein the apparatus is arranged to monitor electrical current in a supply line connected to a battery included in the vehicle.

10. A computer program product stored on a tangible computer readable medium having code executable by a computer processor to perform a method for processing data flows in accordance with claim 1.

11. The computer program product of claim 10 wherein the computer program product comprises at least one from a group consisting of: a hard disk, a CD-ROM, an optical storage device, a magnetic storage device, a Read Only Memory, a Programmable Read Only Memory, an Erasable Programmable Read Only Memory, EPROM, an Electrically Erasable Programmable Read Only Memory and a Flash memory.

* * * * *